US011309278B2

(12) United States Patent
Lianto et al.

(10) Patent No.: US 11,309,278 B2
(45) Date of Patent: Apr. 19, 2022

(54) METHODS FOR BONDING SUBSTRATES

(71) Applicant: APPLIED MATERIALS, INC., Santa Clara, CA (US)

(72) Inventors: Prayudi Lianto, Singapore (SG); Guan Huei See, Singapore (SG); Sriskantharajah Thirunavukarasu, Singapore (SG); Arvind Sundarrajan, Singapore (SG); Xundong Dai, Singapore (SG); Peter Khai Mum Fung, Singapore (SG)

(73) Assignee: APPLIED MATERIALS, INC., Santa Clara, CA (US)

(*) Notice: Subject to any disclaimer, the term of this patent is extended or adjusted under 35 U.S.C. 154(b) by 484 days.

(21) Appl. No.: 16/520,680

(22) Filed: Jul. 24, 2019

(65) Prior Publication Data

US 2020/0135690 A1 Apr. 30, 2020

Related U.S. Application Data

(60) Provisional application No. 62/751,819, filed on Oct. 29, 2018.

(51) Int. Cl.
*G11C 16/04* (2006.01)
*H01L 23/00* (2006.01)
(Continued)

(52) U.S. Cl.
CPC .............. *H01L 24/83* (2013.01); *H01L 24/29* (2013.01); *B23K 20/023* (2013.01);
(Continued)

(58) Field of Classification Search
CPC ................ H01L 24/83; H01L 24/29; H01L 2224/29124; H01L 2224/29147
See application file for complete search history.

(56) References Cited

U.S. PATENT DOCUMENTS

| 4,418,858 A | 12/1983 | Miller |
| 5,364,004 A | 11/1994 | Davidson |
(Continued)

FOREIGN PATENT DOCUMENTS

| KR | 10-2014-0140042 A | 12/2014 |
| WO | WO 2014-184988 A1 | 11/2014 |

OTHER PUBLICATIONS

International Search Report for PCT/US2019/058280, dated Feb. 17, 2020.

*Primary Examiner* — Pho M Luu
(74) *Attorney, Agent, or Firm* — Moser Taboada

(57) ABSTRACT

Methods for bonding substrates used, for example, in substrate-level packaging, are provided herein. In some embodiments, a method for bonding substrates includes: performing electrochemical deposition (ECD) to deposit at least one material on each of a first substrate and a second substrate, performing chemical mechanical polishing (CMP) on the first substrate and the second substrate to form a bonding interface on each of the first substrate and the second substrate, positioning the first substrate on the second substrate so that the bonding interface on the first substrate aligns with the bonding interface on the second substrate, and bonding the first substrate to the second substrate using the bonding interface on the first substrate and the bonding interface on the second substrate.

18 Claims, 4 Drawing Sheets

(51) Int. Cl.
*B23K 101/40* (2006.01)
*B23K 20/02* (2006.01)

(52) U.S. Cl.
CPC .................. *B23K 2101/40* (2018.08); *H01L 2224/2957* (2013.01); *H01L 2224/29124* (2013.01); *H01L 2224/29147* (2013.01); *H01L 2224/29582* (2013.01); *H01L 2224/29609* (2013.01); *H01L 2224/29611* (2013.01); *H01L 2224/29613* (2013.01); *H01L 2224/29616* (2013.01); *H01L 2224/29639* (2013.01); *H01L 2224/29644* (2013.01); *H01L 2224/29647* (2013.01); *H01L 2224/29666* (2013.01); *H01L 2224/83031* (2013.01); *H01L 2224/83092* (2013.01); *H01L 2224/83097* (2013.01); *H01L 2224/83375* (2013.01); *H01L 2224/83379* (2013.01); *H01L 2224/83895* (2013.01)

(56) References Cited

U.S. PATENT DOCUMENTS

| | | | |
|---|---|---|---|
| 6,313,529 | B1 | 11/2001 | Yoshihara et al. |
| 6,350,632 | B1 | 2/2002 | Lin |
| 6,809,414 | B1 | 10/2004 | Lin et al. |
| 7,112,521 | B1 | 9/2006 | Lin et al. |
| 9,653,371 | B2 | 5/2017 | Moriyama |
| 9,831,154 | B2 * | 11/2017 | Tsai ................. H01L 23/481 |
| 10,481,461 | B2 * | 11/2019 | Cho ................. G02F 1/163 |
| 10,622,321 | B2 * | 4/2020 | Yu ................. H01L 29/0649 |
| 2018/0226371 | A1 | 8/2018 | Enquist |
| 2018/0233479 | A1 | 8/2018 | Hamed et al. |
| 2020/0135690 | A1 * | 4/2020 | Lianto ................. H01L 24/29 |

* cited by examiner

METHODS FOR BONDING SUBSTRATES

CROSS-REFERENCE TO RELATED APPLICATIONS

The application claims the benefit of and priority to U.S. Provisional Application Ser. No. 62/751,819, which was filed on Oct. 29, 2018, the entire contents of which are incorporated herein by reference.

FIELD

The disclosure generally relates to methods for substrate processing, and more particularly, to methods for bonding substrates, for example, used in substrate-level packaging.

BACKGROUND

Current copper-copper (Cu—Cu) bonding processing techniques, while suitable for use in substrate-level packaging, have one or more drawbacks. For example, to achieve sufficient bonding strength for bonding Cu surfaces to each other, which can become highly oxidized during substrate-level packaging, current Cu—Cu bonding processing techniques use temperatures that can range from about 300°-400° C. and bonding pressures that can exceed a few megapascals (MPa). Using such high temperatures/pressures, however, can result in alignment inaccuracies when the substrates (e.g., silicon (Si) substrates) including the Cu surface are bonded to each other, e.g., due to coefficient of thermal expansion (CTE) mismatch between Si on the substrate and Cu used for bonding. Moreover, such high temperatures/pressures can sometimes damage the underlying substrates and/or the circuits formed thereon. Furthermore, the long processing times (which can exceed 30 minutes) and stringent vacuum requirements (which are needed to reduce oxidation on the Cu surface) associated with current Cu—Cu bonding processing techniques can reduce throughput of the substrates that can be bonded together and increase cost of processing.

As such, the inventors have provided improved techniques for processing substrates.

SUMMARY

Provided herein are methods for bonding substrates used, for example, in substrate-level packaging. In some embodiments, methods for bonding substrates include: performing electrochemical deposition (ECD) to deposit at least one material on each of a first substrate and a second substrate, performing chemical mechanical polishing (CMP) on the first substrate and the second substrate to form a bonding interface on each of the first substrate and the second substrate, positioning the first substrate on the second substrate so that the bonding interface on the first substrate aligns with the bonding interface on the second substrate, and bonding the first substrate to the second substrate using the bonding interface on the first substrate and the bonding interface on the second substrate.

In some embodiments, methods for bonding substrates include: performing physical vapor deposition (PVD) to deposit a first material on each of a first substrate and a second substrate, performing ECD to deposit a second material on each of the first substrate and the second substrate, performing CMP on the first substrate and the second substrate to form a bonding interface of the second material on each of the first substrate and the second substrate, positioning the first substrate on the second substrate so that the bonding interface on the first substrate aligns with the bonding interface on the second substrate, and bonding the first substrate to the second substrate using the bonding interface on the first substrate and the bonding interface on the second substrate.

In some embodiments, a nontransitory computer readable storage medium is provided having instructions stored thereon that, when executed by a processor, causes a method for bonding substrates to be performed. The method can include any of the embodiments disclosed herein. In some embodiments, the method includes: performing ECD to deposit at least one material on each of a first substrate and a second substrate, performing CMP on the first substrate and the second substrate to form a bonding interface on each of the first substrate and the second substrate, positioning the first substrate on the second substrate so that the bonding interface on the first substrate aligns with the bonding interface on the second substrate, and bonding the first substrate to the second substrate using the bonding interface on the first substrate and the bonding interface on the second substrate.

In some embodiments, methods for bonding substrates include: performing ECD to deposit at least one material on each of a first substrate and a second substrate and form a bonding interface on each of the first substrate and the second substrate, positioning the first substrate on the second substrate so that the bonding interface on the first substrate aligns with the bonding interface on the second substrate, and bonding the first substrate to the second substrate using the bonding interface on the first substrate and the bonding interface on the second substrate.

Other and further embodiments of the disclosure are described below.

BRIEF DESCRIPTION OF THE DRAWINGS

Embodiments of the disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
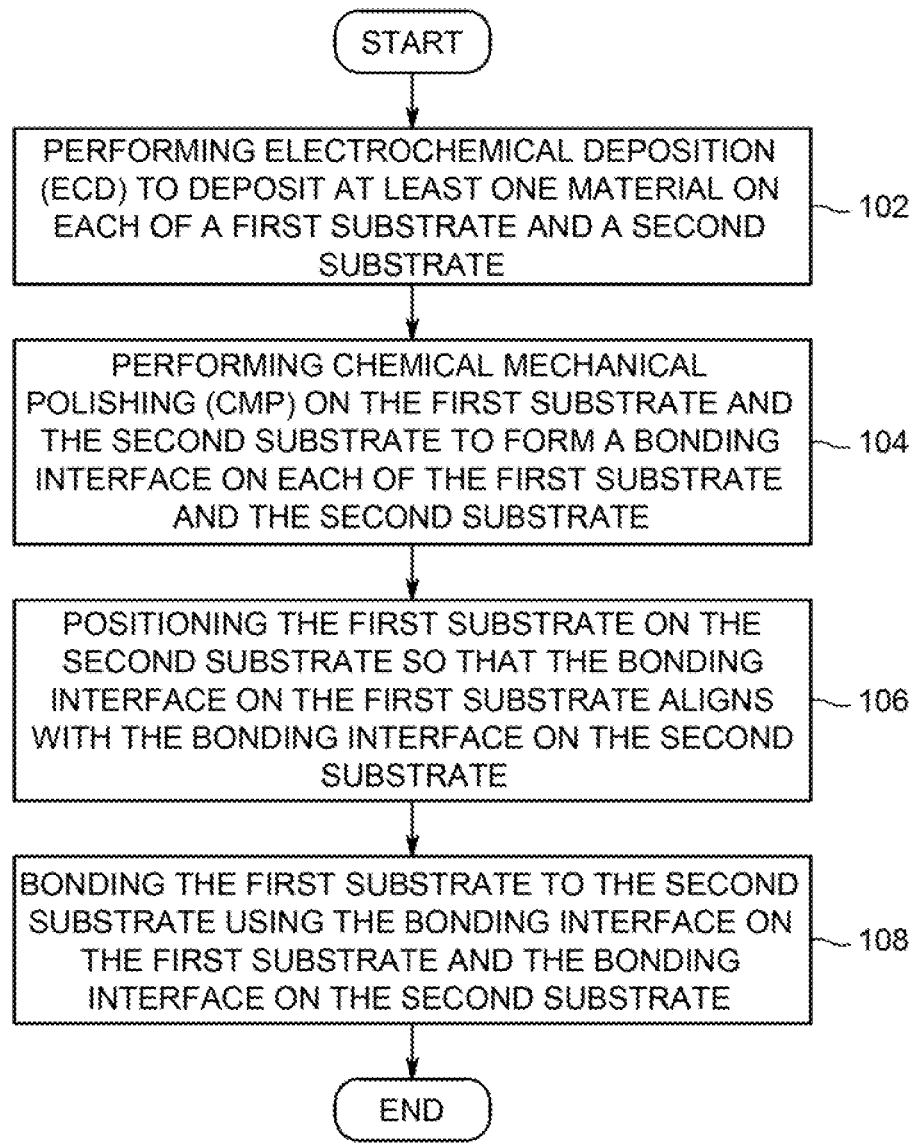
FIG. 1 is a flowchart of a method for bonding substrates used in substrate-level packaging, in accordance with at least some embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Now herein described are methods for copper-to-copper (Cu—Cu) bonding used in substrate-level packaging.

FIG. 1 is a flowchart of a method for bonding substrates used in substrate-level packaging, and FIGS. 2A-2G are schematic diagrams of a substrate 200 formed using the method of FIG. 1 in accordance with at least some embodiments of the disclosure.

Figure 2:
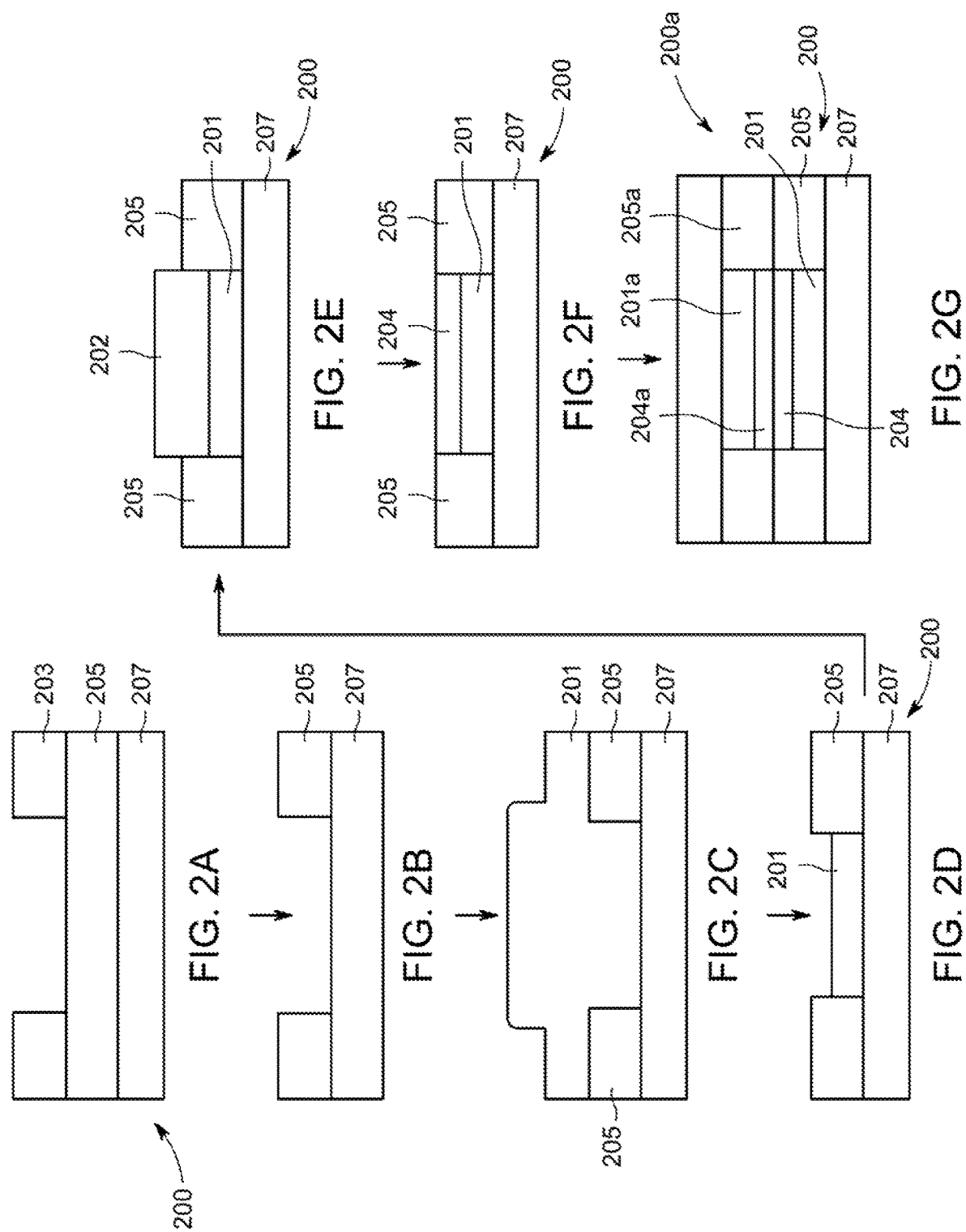
FIGS. 2A-2G are schematic diagrams of a substrate formed using the method of FIG. 1, in accordance with at least some embodiments of the disclosure.

Prior to performing the method of FIG. 1, the substrate 200 can be pre-formed using one or more suitable materials and one or more conventional preprocessing techniques. For example, preprocessing of the substrate 200 can include performing a lithographic process on the substrate 200 that includes a bottom layer 207, formed of silicon (Si) or other suitable metal, a dielectric layer 205 (e.g. oxide, polymer, or the like) that is deposited on the bottom layer 207, and a photoresist (PR) layer 203 deposited on the dielectric layer 205 (FIG. 2A). After the lithographic process is completed, an etch and PR strip process can be performed on the substrate 200 (FIG. 2B) to remove the PR layer 203 and some of the dielectric layer 205. A physical vapor deposition (PVD) process and/or an ECD process can be used to deposit one or more suitable interconnect materials 201, e.g., copper (Cu), aluminum (Al), or other suitable materials, on the bottom layer 207 and dielectric layer 205 of the substrate 200 (FIG. 2C). Thereafter, a CMP process can be used to remove some of the interconnect material 201, on which one or more materials can be deposited to form a bonding interface (FIG. 2D) used to bond two substrates 200 to each other. The thickness (or amount) of interconnect material 201 that is left on the bottom layer 207 and dielectric layer 205 of the substrate 200 after the CMP process is performed on the substrate 200 can depend on one or more factors, e.g., a thickness of the dielectric layer 205, a thickness the bottom layer 207, intended use of the substrate 200, etc.

In accordance with the method of FIG. 1, a first substrate (e.g., the substrate 200) and a second substrate (e.g., a substrate 200a (FIG. 2G) that is identical to substrate 200) can be bonded to each other. For illustrative purposes, unless otherwise noted, the method of FIG. 1 is described in terms of the substrate 200. At 102, an ECD process is performed on the substrate 200 (and the substrate 200a) of FIG. 2D to deposit one or more materials on the surface of the interconnect material 201 of the substrate 200. The materials that can be deposited on the surface of the interconnect material 201 can include, but are not limited to, tin (Sn), silver (Ag), lead (Pb), indium (In), bismuth (Bi), gold (Au) or combinations thereof (e.g., (SnAg) eutectic solder 202). The thickness of the solder 202 deposited on the surface of the interconnect material 201 can range from about 1 µm to about 5 µm (FIG. 2E), though the thickness of the solder 202 can be less than 1 µm and greater than 5 µm (FIG. 2F), and can be adjusted to accommodate a specific configuration of the interconnect material 201, the dielectric layer 205, the bottom layer 207, and/or specific manufacturing capabilities of a manufacturer.

For example, when the ECD processes at 102 can provide a controlled deposition of the solder 202 onto the surface of the interconnect material 201 (e.g., a thickness ranging from 50 nm to about 100 nm (see FIG. 2F, for example)), a controlled dishing/protrusion, or bonding interface of solder 204 (interface solder 204) can be formed on the surface of the interconnect material 201 using the EMP process at 102, i.e., so that the interface solder 204 does not extend past the surface of the dielectric layer 205.

Alternatively, when the EMP process at 102 cannot provide a controlled deposition of the solder 202 onto the surface of the interconnect material 201 (FIG. 2E), at 104 an optional CMP process is performed on the substrate 200 (and substrate 200a) to help form the interface solder 204 on the surface of the interconnect material 201 of substrate 200 (FIG. 2F). As noted above, the thickness/amount of the interface solder 204 that remains on the surface of the interconnect material 201 can range from 50 nm to about 100 nm, though the thickness of the interface solder 204 can be less than 50 nm and greater than 100 nm. Again, the thickness of the interface solder 204 can be adjusted to accommodate a specific configuration of the interconnect material 201, the dielectric layer 205, and/or bottom layer 207.

To bond the substrate 200 to the substrate 200a, at 106 the two substrates 200, 200a can be positioned on top of each other such that the interface solder 204, 204a on the two substrates 200, 200a are aligned with each other (FIG. 2G). Once aligned, at 108 one or more known bonding processes including, but not limited to, thermocompression bonding, hybrid bonding, or other known bonding process can be used to bond the substrates 200, 200a to each other using the interface solder 204, 204a. The bonding processes can be performed at atmospheric pressure, and the temperature at which the bonding processes can be performed can range from about 230° C. to about 250° C., though the temperature can be less than 230° C. and greater than 250° C., i.e., since the interface solder 204 is formed using materials having a relatively low melting point (e.g., eutectic solder 202).

After the two substrates 200, 200a are bonded to each other at the interface solder 204, 204a, a fine pitch interconnect between the two substrates 200, 200a is achieved—with no gap present between the non-bonded surfaces of the dielectric layer 205, 205a of the substrates 200, 200a.

Figure 3:
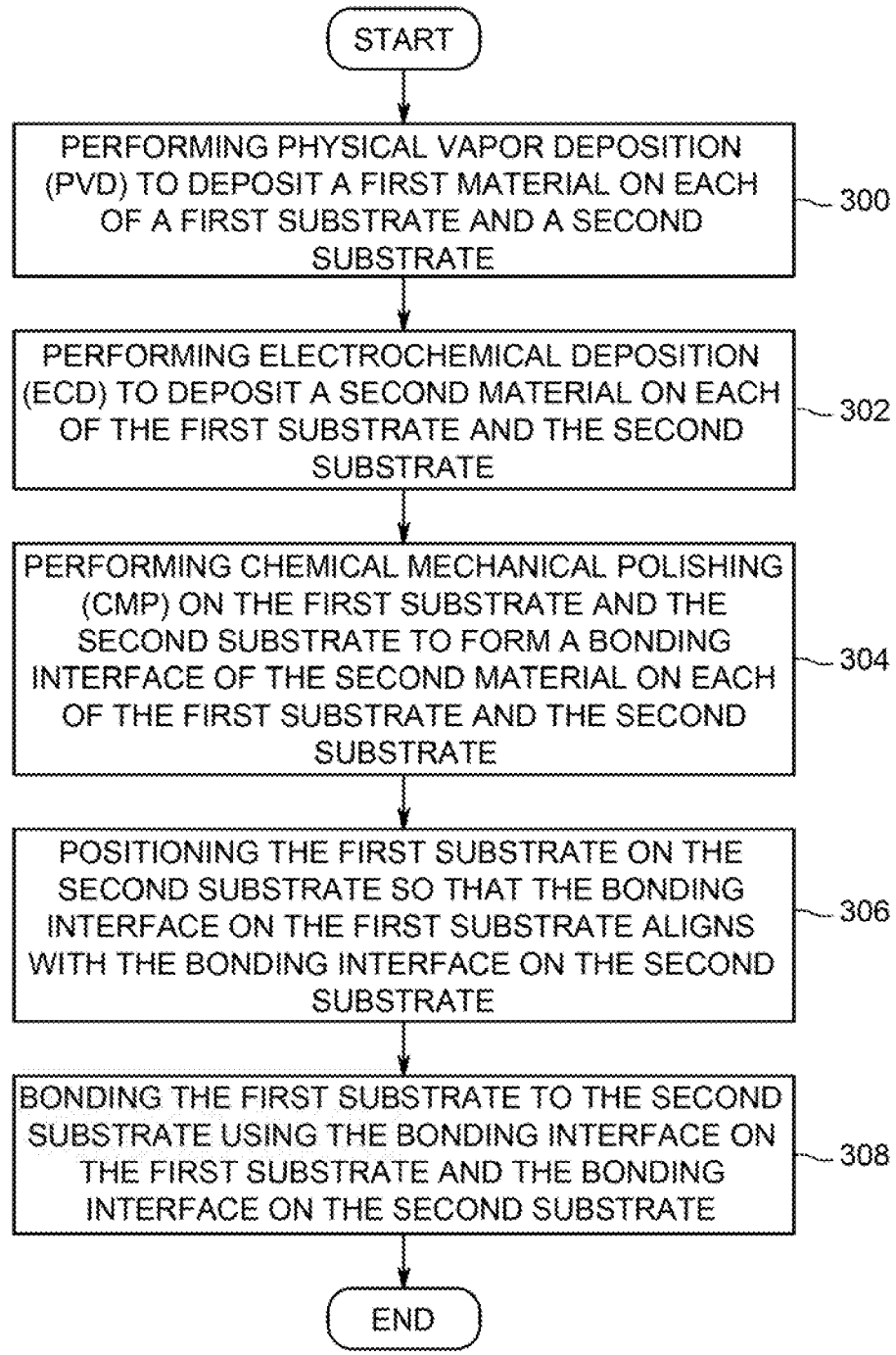
FIG. 3 is a flowchart of a method for bonding substrates used in substrate-level packaging, in accordance with at least some embodiments of the disclosure.
Figure 4A:
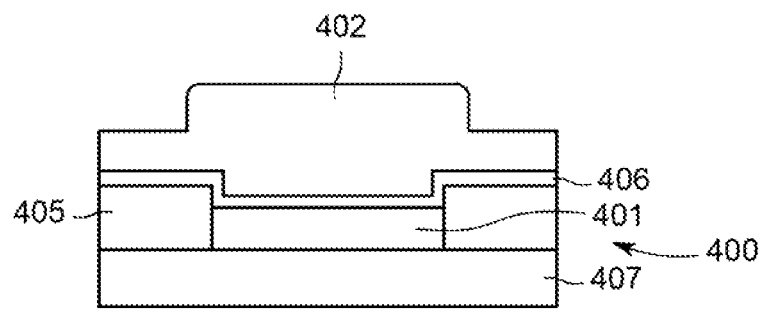
FIGS. 4A-4C are schematic diagrams of a substrate formed using the method of FIG. 3, in accordance with at least some embodiments of the disclosure.
Figure 4B:
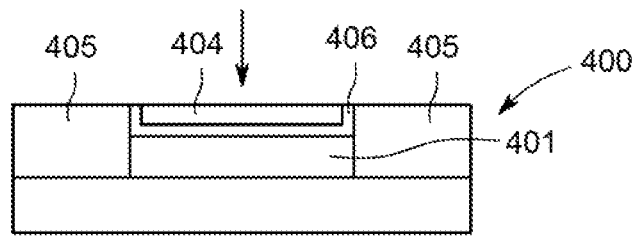

FIG. 3 is a flowchart of a method for bonding a first substrate (e.g., a substrate 400 (FIGS. 4A and 4B)) to a second substrate (e.g., a substrate 400a that is identical to the substrate 400 (FIG. 4C)). The method of FIG. 3 used to form the substrates 400, 400a is substantially identical to the method used to form the substrates 200, 200a of FIGS. 2A-2G. Accordingly, only those features unique to method for forming the substrates 400, 400a are herein described. For illustrative purposes, unless otherwise noted, the method of FIG. 3 is described in terms of the substrate 400.

Prior to performing an ECD process on the substrate 400 (and the substrate 400a), at 300 a PVD process is performed on the substrate 400 (and the substrate 400a) to deposit a layer of one or more suitable materials on the interconnect material 401, which can provide a surface for the solder 402 to adhere to. For example, a layer 406 of Cu, titanium (Ti), or combination thereof can be deposited on the interconnect material 401. The thickness of the layer 406 can range from 0.1 µm to about 1 µm, though the thickness of the layer 406 can be less than 0.1 µm and greater than 1 µm. The thickness of the layer 406 can be adjusted to accommodate a specific configuration of the interconnect material 401, the dielectric 405, the bottom layer 407, and/or the solder 402 that is to be deposited on the layer 406.

At 302 the ECD process is performed on the substrate 400 (and the substrate 400a) to deposit the solder 402 on the surface of the layer 406 (like the ECD process at 102). Prior to performing the ECD process at 302, one or more other processes can be performed on the layer 406, e.g., an etch process, a CMP process, etc. to help obtain a desired thickness of layer 406.

Figure 4C:
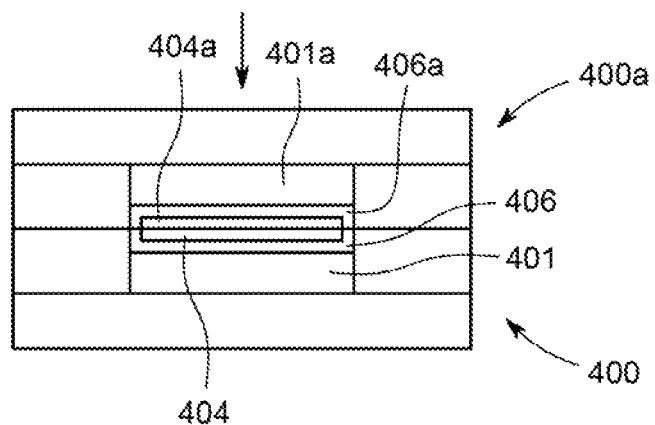

After the solder 402 is deposited on the surface of the layer 406 at 302, a CMP process (like the CMP process at 104) can be performed on the substrate 400 (and the substrate 400a) at 304, and to bond the substrates 400, 400a to each other, at 306 the two substrates 400, 400a can be positioned on top of each other such that the interface solder 404, 404a and the layers 406, 406a (e.g., remaining parts of the layers 406, 406a after the CPM process is performed) on the two substrates 400, 400a are aligned with each other (FIG. 4C). Once aligned, the above described bonding processes can be carried out to bond the two substrates 400, 400a to each other at 308.

The methods for bonding substrates described herein provide a relatively simple and cost efficient manner for substrate-level packaging, and overcome the drawbacks typically associated with conventional substrate bonding processes. More particularly, the bonding processes described herein use relatively low temperature/pressure to bond the two substrates 200/200a, 400/400a to each other, when compared to conventional bonding processes, which, as noted above, use high temperature/pressure, e.g., 300°-400° C. and a few MPa.

While the foregoing is directed to embodiments of the disclosure, other and further embodiments of the disclosure may be devised without departing from the basic scope thereof.

What is claimed is:

1. A method for bonding substrates, comprising:
   performing electrochemical deposition (ECD) to deposit at least one material on each of a first substrate and a second substrate;
   performing chemical mechanical polishing (CMP) on the first substrate and the second substrate to form a bonding interface on each of the first substrate and the second substrate;
   positioning the first substrate on the second substrate so that the bonding interface on the first substrate aligns with the bonding interface on the second substrate; and
   bonding the first substrate to the second substrate using the bonding interface on the first substrate and the bonding interface on the second substrate, wherein bonding the first substrate to the second substrate is performed at a temperature not exceeding 250° C.

2. The method of claim 1, wherein the at least one material is at least one of Sn, Ag, Pb, In, Bi, or Au.

3. The method of claim 2, wherein at least one of the first substrate and the second substrate comprises at least one of Cu or Al, and at least one of Si, oxide, or a polymer, and
   wherein the at least one material is deposited on the at least one of Cu or Al.

4. The method of claim 1, wherein the at least one material is deposited on each of the first substrate and the second substrate to a thickness not exceeding 5 µm.

5. The method of claim 1, wherein after CMP is performed, the bonding interface on the first substrate and the bonding interface on the second substrate each has a thickness not exceeding 100 nm.

6. The method of claim 1, wherein bonding the first substrate to the second substrate is performed at atmospheric pressure.

7. The method of claim 1 further comprising:
   performing physical vapor deposition (PVD) to deposit a first material on each of the first substrate and the second substrate,
   wherein performing ECD to deposit the at least one material on each of the first substrate and the second substrate comprises performing ECD to deposit a second material on each of the first substrate and the second substrate, and
   wherein performing CMP on the first substrate and the second substrate to form the bonding interface on each of the first substrate and the second substrate comprises performing on the first substrate and the second substrate to form a bonding interface of the second material on each of the first substrate and the second substrate.

8. The method of claim 7, wherein the first material is one of Ti, Cu, and combinations thereof, and the second material is one of Sn, Ag, Pb, In, Bi, or Au.

9. The method of claim 8, wherein at least one of the first substrate and the second substrate comprises at least one of Cu or Al, and at least one of Si, oxide, or a polymer, and
   wherein the first material is deposited on the at least one of Cu or Al, and the second material is deposited on the first material.

10. The method of claim 7, wherein the first material is deposited to a thickness not exceeding 1 µm, and
    wherein the second material is deposited to a thickness not exceeding 5 µm.

11. The method of claim 7, wherein after CMP is performed, the bonding interface and the first material on the first substrate have a combined thickness not exceeding 100 nm, and the bonding interface and the first material on the second substrate have a combined thickness not exceeding 100 nm.

12. The method of claim 7, wherein bonding the first substrate to the second substrate is performed at atmospheric pressure.

13. The method of claim 7, wherein bonding the first substrate to the second substrate is performed at a temperature not exceeding 250° C.

14. A nontransitory computer readable storage medium having stored thereon instructions that when executed by a processor perform a method for bonding substrates, the method comprising:
    performing electrochemical deposition (ECD) to deposit at least one material on each of a first substrate and a second substrate;
    performing chemical mechanical polishing (CMP) on the first substrate and the second substrate to form a bonding interface on each of the first substrate and the second substrate;
    positioning the first substrate on the second substrate so that the bonding interface on the first substrate aligns with the bonding interface on the second substrate; and
    bonding the first substrate to the second substrate using the bonding interface on the first substrate and the bonding interface on the second substrate,
    wherein bonding the first substrate to the second substrate is performed at a temperature not exceeding 250° C.

15. The nontransitory computer readable storage medium of claim 14, wherein the at least one material is at least one of Sn, Ag, Pb, In, Bi, or Au,
    wherein at least one of the first substrate and the second substrate comprises at least one of Cu or Al, and at least one of Si, oxide, or a polymer,
    wherein the at least one material is deposited on the at least one of Cu or Al, and
    wherein the at least one material is deposited on each of the first substrate and the second substrate to a thickness not exceeding 5 µm.

16. The nontransitory computer readable storage medium of claim 14, wherein after CMP is performed, the bonding interface on the first substrate and the bonding interface on the second substrate each has a thickness not exceeding 100 nm.

17. The nontransitory computer readable storage medium of claim 14, wherein bonding the first substrate to the second substrate is performed at atmospheric pressure.

18. A method for bonding substrates, comprising:
performing electrochemical deposition (ECD) to deposit at least one material on each of a first substrate and a second substrate and form a bonding interface on each of the first substrate and the second substrate;
after performing ECD, performing chemical mechanical polishing (CMP) on the first substrate and the second substrate such that the formed bonding interface on each of the first substrate and the second substrate has a thickness not exceeding 100 nm;
positioning the first substrate on the second substrate so that the bonding interface on the first substrate aligns with the bonding interface on the second substrate; and
bonding the first substrate to the second substrate using the bonding interface on the first substrate and the bonding interface on the second substrate.

\* \* \* \* \*